United States Patent
Lee et al.

(10) Patent No.: US 11,908,667 B2
(45) Date of Patent: Feb. 20, 2024

(54) CERAMIC SUSCEPTOR

(71) Applicant: MICO CERAMICS LTD., Anseong-si (KR)

(72) Inventors: Ju Sung Lee, Anseong-si (KR); Haneum Bae, Anseong-si (KR)

(73) Assignee: MICO CERAMICS LTD., Anseong-si (KR)

( * ) Notice: Subject to any disclaimer, the term of this patent is extended or adjusted under 35 U.S.C. 154(b) by 0 days.

(21) Appl. No.: 17/659,832

(22) Filed: Apr. 19, 2022

(65) Prior Publication Data

US 2022/0238316 A1    Jul. 28, 2022

Related U.S. Application Data

(63) Continuation of application No. PCT/KR2021/015160, filed on Oct. 27, 2021.

(30) Foreign Application Priority Data

Dec. 31, 2020    (KR) ........................ 10-2020-0188893

(51) Int. Cl.
*H01L 21/683* (2006.01)
*H01T 23/00* (2006.01)
(Continued)

(52) U.S. Cl.
CPC .... *H01J 37/32724* (2013.01); *C23C 16/4586* (2013.01); *C23C 16/52* (2013.01);
(Continued)

(58) Field of Classification Search
CPC ........ H01J 37/32724; H01J 2237/3321; C23C 16/4586
(Continued)

(56) References Cited

U.S. PATENT DOCUMENTS 10,147,610 B1 * 12/2018 Lingampalli ......... C23C 16/515
2008/0314320 A1 * 12/2008 Balma ............... H01L 21/68792
118/728
(Continued)

FOREIGN PATENT DOCUMENTS

JP    2016-184642 A    10/2016
JP    2019-525479 A    9/2019
(Continued)

OTHER PUBLICATIONS

International Search Report & Written Opinion for PCT/KR2021/015160, the International Searching Authority, dated Feb. 4, 2022.
(Continued)

*Primary Examiner* — Jared Fureman
*Assistant Examiner* — Lucy M Thomas
(74) *Attorney, Agent, or Firm* — BROADVIEW IP LAW, PC

(57) ABSTRACT

The present disclosure relates to a ceramic susceptor. The ceramic susceptor of the present disclosure includes: an insulating plate on which a high-frequency electrode is disposed; a shaft connected to the insulating plate; a connection mount connected to a longitudinal end of the shaft; a first rod and a second rod, which are connected to the high-frequency electrode, pass through the longitudinal end of the shaft, and extend to the connection mount; and a connection member disposed in the connection mount, wherein the connection member connects the first rod to the second rod.

4 Claims, 5 Drawing Sheets

(51) Int. Cl.
*H01J 37/32* (2006.01)
*C23C 16/458* (2006.01)
*C23C 16/52* (2006.01)

(52) U.S. Cl.
CPC .... *H01J 37/32082* (2013.01); *H01L 21/6833* (2013.01); *H01J 2237/3321* (2013.01)

(58) Field of Classification Search
USPC ........................................................ 361/234
See application file for complete search history.

(56) References Cited

U.S. PATENT DOCUMENTS

| | | | |
|---|---|---|---|
| 2012/0103970 A1* | 5/2012 | Lubomirsky | H01L 21/68792 219/460.1 |
| 2014/0087587 A1 | 3/2014 | Lind | |
| 2017/0278682 A1 | 9/2017 | Lin et al. | |
| 2022/0108909 A1* | 4/2022 | Tamura | H01L 21/3065 |

FOREIGN PATENT DOCUMENTS

| | | |
|---|---|---|
| JP | WO 2021 024858 A1 * | 2/2021 |
| KR | 10-2014-0038910 A | 3/2014 |
| KR | 10-2018-0034840 A | 4/2018 |
| KR | 10-2018-0121662 A | 11/2018 |
| KR | 10-2019-0074180 A | 6/2019 |
| KR | 102137719 B1 | 7/2020 |
| KR | 10-2020-0136109 A | 12/2020 |

OTHER PUBLICATIONS

Office Action for CN Application No. 202180005660.7 by China National Intellectual Property Administration dated Sep. 15, 2022.
Notice of Allowance for JP2022-528019 by Japan Patent Office dated Dec. 22, 2022.

* cited by examiner

CERAMIC SUSCEPTOR

CROSS-REFERENCE TO RELATED APPLICATIONS

This application is a continuation of pending PCT International Application No. PCT/KR2020/015160, filed on Oct. 27, 2021, which claims priority to Korean Patent Application No. 10-2020-0188893 filed in the Korean Intellectual Property Office on Dec. 31, 2020, the entire contents of which are incorporated herein by reference.

TECHNICAL FIELD

The present disclosure relates to a ceramic susceptor and, more particularly, to a ceramic susceptor having a structure for reducing heat generated by a high-frequency electrode unit.

BACKGROUND ART

A semiconductor device or display device is generally manufactured by successively stacking multiple thin-film layers including a dielectric layer and a metal layer on a glass substrate, flexible substrate, or semiconductor wafer substrate, successively, and then patterning the same. These thin-film layers are successively deposited on the substrate through a chemical vapor deposition (CVD) process or physical vapor deposition (PVD) process. Examples of the CVD process include a low-pressure CVD (LPCVD) process, a plasma-enhanced CVD (PECVD) process, and a metal organic CVD (MOCVD) process.

Such CVD devices and PVD devices have heaters disposed so as to support glass substrates, flexible substrates, or semiconductor wafer substrates and to apply a predetermined amount of heat. Ceramic heaters are widely installed on the CVD devices and PVD devices according to requirements such as accurate temperature control and heat treatment during plasma deposition processes or the like for the purpose of precise processes such as micro-wiring of semiconductor elements. In addition, the heaters are used to form plasma and to heat substrates during a process for etching thin-film layers formed on semiconductor wafer substrates or during a photoresist sintering process.

Referring to FIG. 1, a conventional ceramic susceptor 1 includes an insulating plate 10 coupled to a shaft 20, the insulating plate 10 includes an RF electrode 12 disposed inside a ceramic material, and the RF electrode 12 is connected to a power supply 26 through parallel rods 21 and 23 in order to reduce the load. RF power has been increasing for the purpose of microlevel semiconductor processes and productivity improvement, and two separate RF electrode rods 21 and 23 are installed inside the shaft 20 to reduce the load, and a connecting member 24 connected to the power supply 26 is used to connect the electrode rods 21 and 23 through another rod 25 inside the shaft 20. Such a conventional technology is disclosed in Korean Patent Registration No. 10-2137719 (Jul. 24, 2020).

However, such a conventional structure has a problem in that the high-temperature oxidizing atmosphere inside the shaft may oxidize the RF electrode rods and the connecting member, thereby changing electric characteristics or causing a short circuit with peripheral wires. There is another problem in that it is not easy to connect the RF electrode rods through the connecting structure inside a small-diameter hole of the shaft.

DISCLOSURE

Technical Problem

Therefore, the present disclosure has been made to solve the above-mentioned problems, and it is an aspect of the present disclosure to provide a ceramic susceptor wherein two or more separate RF electrode rods are disposed inside a shaft and are connected inside a connection mount, and the periphery of the connection mount is cooled by a cooling structure such that, even if RF power applied to an RF electrode increases, branching of an electric current at multiple connection rods prevents cracking and arching near the RF electrode and RF electrode rods, enables uniformization of deposition characteristics on a substrate by means of heating, and makes it possible to maintain electric characteristics without short-circuiting caused by oxidation of the RF electrode rods.

Technical Solution

To summarize features of the present disclosure, a ceramic susceptor according to an aspect of the present disclosure includes: an insulating plate on which a high-frequency electrode is disposed; a shaft connected to the insulating plate; a connection mount connected to a longitudinal end of the shaft; a first rod and a second rod, which are connected to the high-frequency electrode, pass through the longitudinal end of the shaft, and extend to the connection mount; and a connection member disposed in the connection mount, wherein the connection member is configured to connect the first rod to the second rod.

The high-frequency electrode includes a first high-frequency electrode and a second high-frequency electrode, and the first rod is electrically connected to the first high-frequency electrode, and the second rod is electrically connected to the second high-frequency electrode.

The ceramic susceptor further includes a separation plate formed at the longitudinal end of the shaft, and the first rod and the second rod pass through the separation plate and extend to the connection mount.

The ceramic susceptor may further include a temperature sensor configured to measure temperature inside the connection mount.

The ceramic susceptor may further include a cooling structure configured to cool the connection mount.

The ceramic susceptor further includes a draw-in rod connected to the connection member, the connection mount is sealed and includes an inlet and an outlet for circulation of a cooling medium, and the draw-in rod is exposed outside through the sealed connection mount.

The ceramic susceptor further includes a fixing plate configured to fix the draw-in rod, and the draw-in rod passes through the fixing plate and is exposed outside through the connection mount.

Advantageous Effects

A ceramic susceptor according to the present disclosure is advantageous in that multiple RF electrode rods inside a shaft are connected inside a connection mount having a cooling structure such that, even if RF power increases, branching of an electric current at multiple connection rods prevents cracking and arching near the RF electrode and RF electrode rods, enables uniformization of deposition characteristics on a substrate by means of heating, and makes it possible to maintain electric characteristics without short-circuiting caused by oxidation of the RF electrode rods.

DESCRIPTION OF DRAWINGS

The accompanying drawings included as a part of the detailed description in order to aid understanding of the present disclosure provide embodiments of the present disclosure and illustrate the technical spirit of the present disclosure together with the detailed description.

Figure 1:
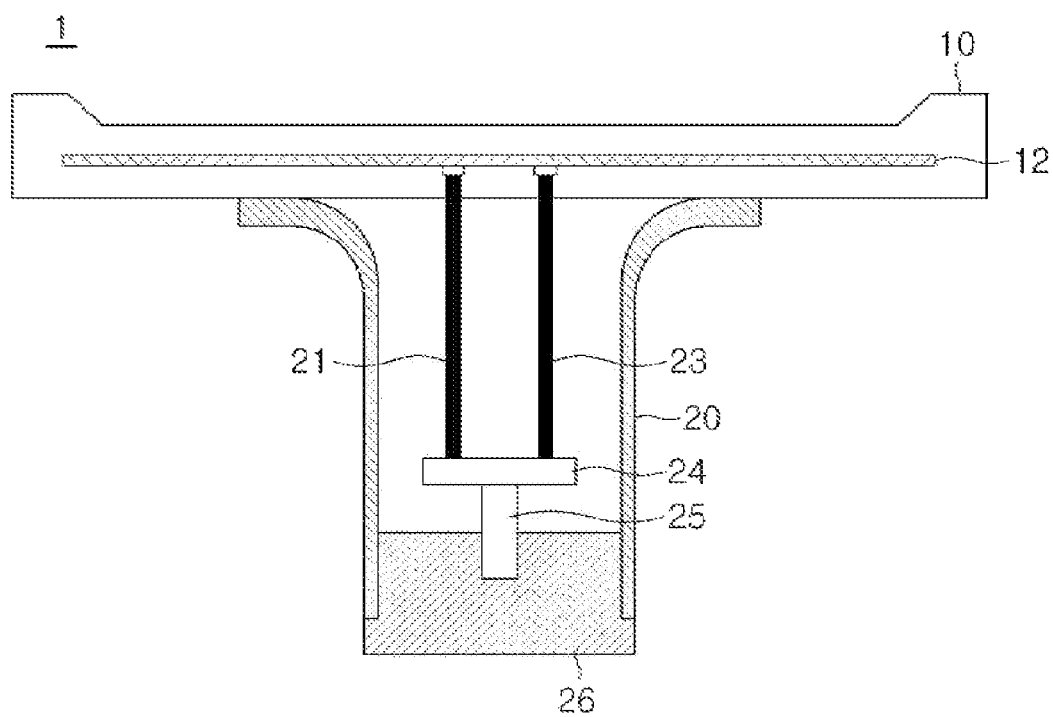
FIG. 1 is a schematic cross-sectional view of a conventional ceramic susceptor.

Hereinafter, the present disclosure will be described in detail with reference to the accompanying drawings. In the drawings, the same elements will be denoted by the same reference numerals, if possible. Furthermore, a detailed description of well-known functions and/or configurations will be omitted. The following description will focus on the parts necessary for understanding operations according to various embodiments, and a description of elements, which may obscure the gist of the description, will be omitted. In addition, some elements in the drawings may be exaggerated, omitted, or schematically illustrated. The size of each element does not entirely reflect the actual size thereof, and therefore the contents described herein are not limited by the relative sizes of or gaps between of the elements illustrated in each drawing.

In describing embodiments of the present disclosure, a detailed description of well-known technologies related to the present disclosure will be omitted when it is determined that the detailed description may unnecessarily obscure the subject matter of the present disclosure. The terms as described below are defined in consideration of the functions in the present disclosure, and may vary depending on the intention of a user or operator, convention, or the like. Therefore, the definitions of the terms should be made based on the contents throughout the specification. The terms used in the detailed description are merely provided to describe the embodiments of the present disclosure, and should not be limited. A singular expression may include a plural expression unless they are definitely different in a context. As used in the present disclosure, the terms "include", "have", and their conjugates are intended merely to denote certain features, numerals, steps, operations, elements, or some or combinations thereof, and should not be construed to exclude the existence of or a possibility of addition of one or more other features, numerals, steps, operations, elements, components, or some or combinations thereof, in addition to the described ones.

Furthermore, the terms "a first", "a second", or the like may be used to describe various elements, but the elements are not limited by the terms. The terms are used only to distinguish one element from another element.

Figure 2:
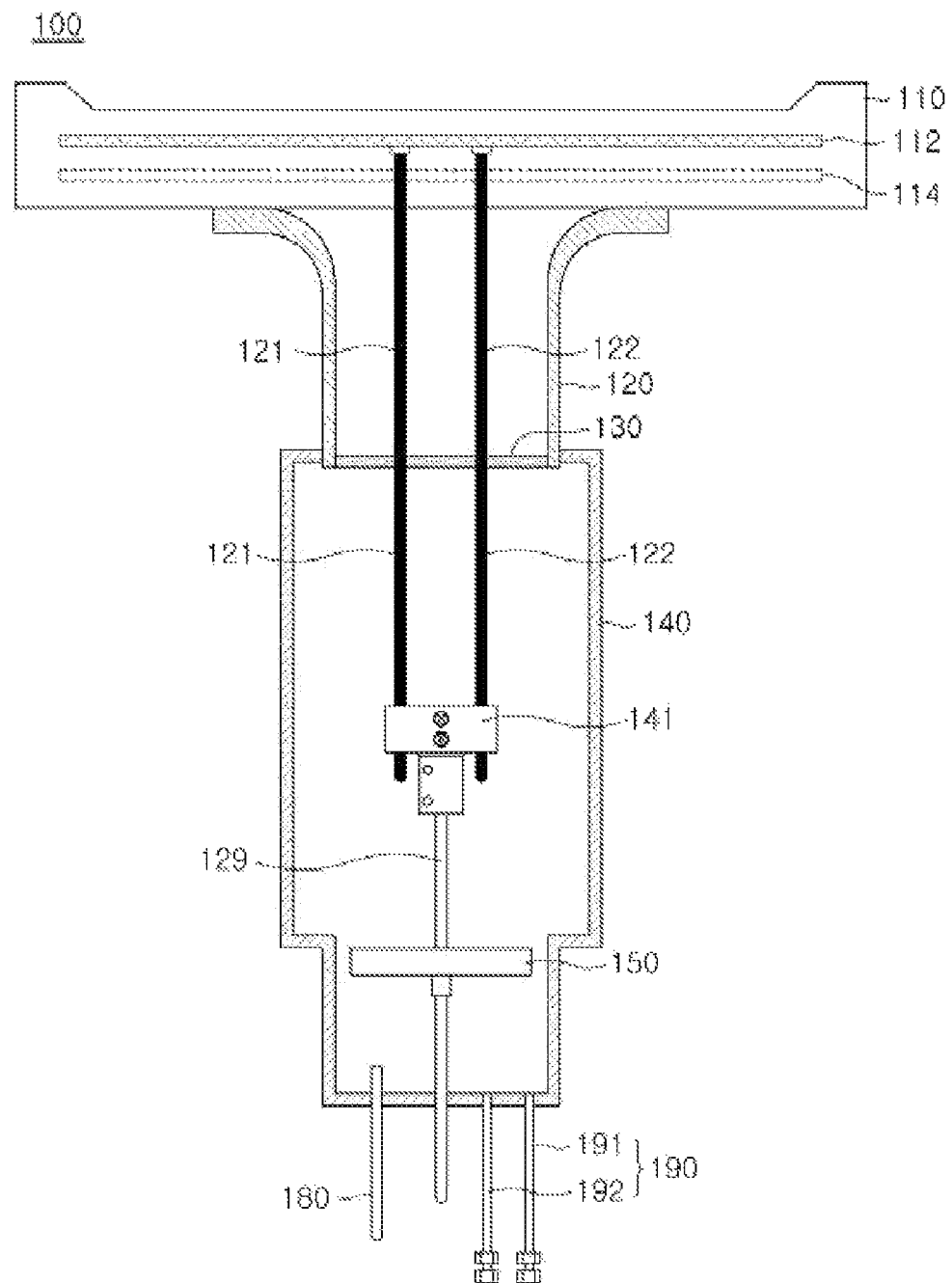
FIG. 2 is a schematic cross-sectional view of a ceramic susceptor according to an embodiment of the present disclosure.

FIG. 2 is a schematic cross-sectional view of a ceramic susceptor 100 according to an embodiment of the present disclosure.

Figure 3:
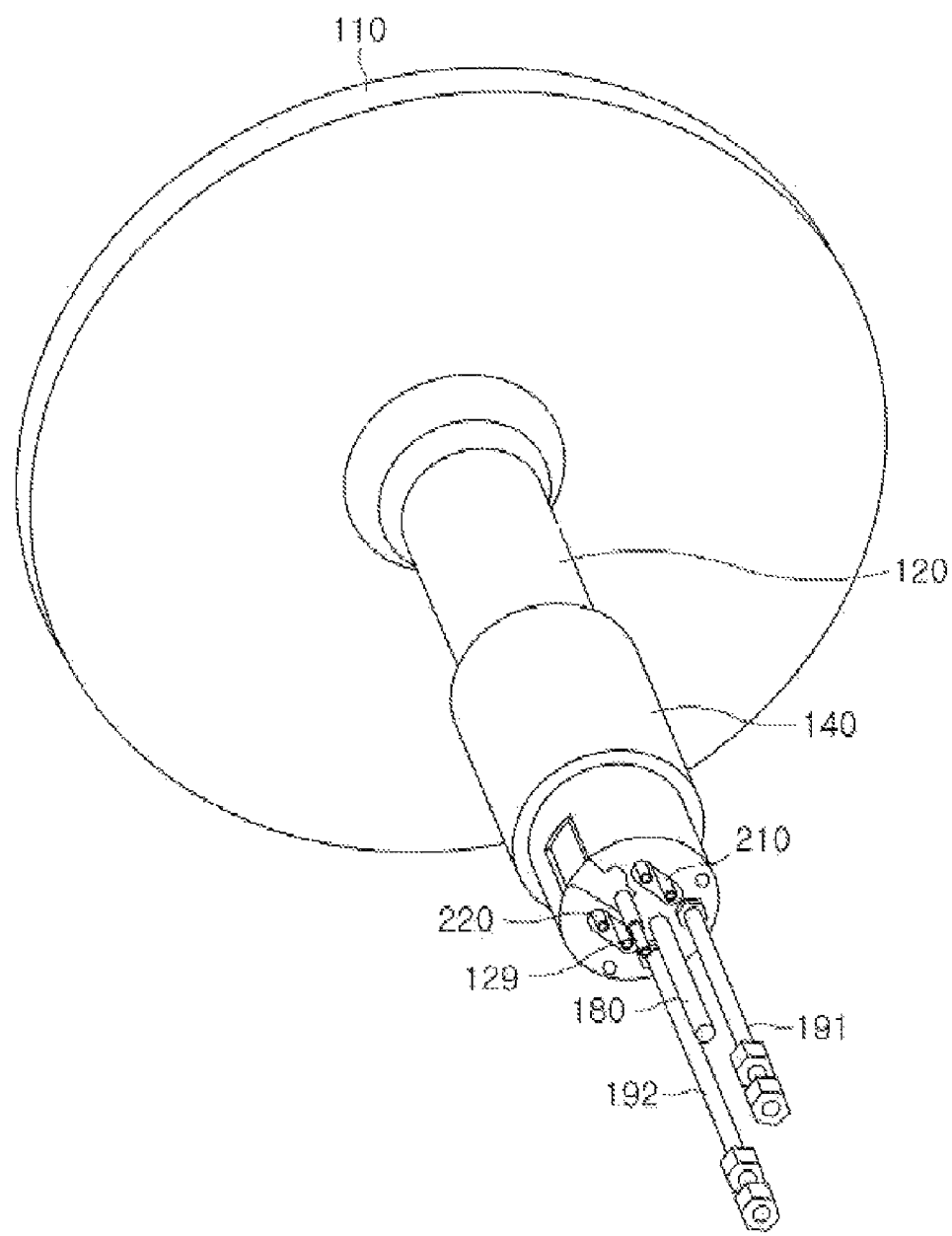
FIG. 3 is a schematic perspective view of a ceramic susceptor according to an embodiment of the present disclosure.

FIG. 3 is a schematic perspective view of the ceramic susceptor 100 according to an embodiment of the present disclosure.

Referring to FIGS. 2 and 3, the ceramic susceptor 100 according to an embodiment of the present disclosure includes an insulating plate 110, a shaft 120, and a connection mount 140. The insulating plate 110, the shaft 120, and the connection mount 140 are sequentially connected to each other, and the separation plate 130 is included between the shaft 120 and the connection mount 140 and is formed at the longitudinal end of the shaft 120 in order to separate inner spaces of the shaft 120 and the connection mount 140 from each other.

The ceramic susceptor 100 according to an embodiment of the present disclosure may be a semiconductor device which supports a multipurpose substrate to be processed, such as a semiconductor wafer, a glass substrate, or a flexible substrate and heats the substrate to be processed at a predetermined temperature. Furthermore, the ceramic susceptor 100 may be used as an electrostatic chuck, and may be used in a process such as plasma enhanced CVD.

The insulating plate 110 is configured such that a high-frequency electrode 112 is disposed (buried) between ceramic materials, and, in some cases, may be further configured such that a heating element 114 is disposed (buried) while being spaced a predetermined interval apart from the high-frequency electrode 112. The insulating plate 110 is configured to enable various semiconductor processes, such as heating using the heating element 114 and (or) a plasma enhanced CVD process using the high-frequency electrode 112, while stably supporting the substrate to be processed. Furthermore, the ceramic susceptor 100 according to an embodiment of the present disclosure may also be used as an electrostatic chuck for chucking and de-chucking the substrate to be processed, by using the high-frequency electrode 112. The insulating plate 110 may be formed as a plate-type structure having a predetermined shape. In an example, the insulating plate 110 may be formed as a circular plate-shaped structure, and is not necessarily limited thereto. Each of the ceramic materials may be at least one among $Al_2O_3$, $Y_2O_3$, $Al_2O_3/Y_2O_3$, $ZrO_2$, autoclaved lightweight concrete (AlC), TiN, AlN, TiC, MgO, CaO, $CeO_2$, $TiO_2$, $B_xC_y$, BN, $SiO_2$, SiC, YAG, mullite, and $AlF_3$, and may be preferably aluminum nitride (AlN). Furthermore, Powder of the ceramic materials is molded and sintered to form the insulating plate 110. In this regard, each ceramic powder may optionally contain yttrium oxide powder in an amount of about 0.1 to 10% and preferably in an amount of about 1 to 5%.

The high-frequency electrode 112 may be formed of tungsten (W), molybdenum (Mo), silver (Ag), gold (Au), niobium (Nb), titanium (Ti), aluminum nitride (AlN), or alloy thereof, and may be preferably formed of molybdenum (Mo). The high-frequency electrode 112 may be connected to a power source (e.g., a ground) through a draw-in rod 129 connected a connection member 141 which connects (short-circuits) connection rods 121 and 122 to each other. The connection rods 121 and 122 are disposed to pass through the inside of the shaft 120 and pass through the separation plate 130. Hereinafter, an example in which there are two connection rods 121 and 122 will be described, but in some cases, there may be three or more connection rods.

The connection mount 140 is connected to the longitudinal end of the shaft 120. The connection rods 121 and 122, having passed through the separation plate 130 at the longitudinal end of the shaft 120, are connected to each other by the connection member 141 disposed in the sealed connection mount 140. The draw-in rod 129 connected to the connection member 141 extends to be drawn out of the connection mount 140 through the bottom of the connection mount 140. The high-frequency electrode 112 has a wire-type or sheet-type mesh structure. The mesh structure is a mesh-type structure formed by crossing multiple metals arranged in a first direction and multiple metals arranged in a second direction each other.

The heating element 114 may be formed in a plate-shaped coil type by a heating wire (or resistance wire) or a flat plate type. Furthermore, the heating element 114 may be formed in a multilayer structure for accurate temperature control. The heating element 114 may be connected to a separate power source for the heating element 114 through connection rods 210 and 220 (which are described in describing FIG. 4), and may also perform a function of heating a substrate to be processed, which is placed on the insulating plate 110, at a predetermined temperature in order to perform a heating or depositing process and an etching process for a substrate in a semiconductor process. Although not illustrated in FIG. 2 (described in describing FIG. 4), the connection rods 210 and 220 may be disposed to pass through the inside of the shaft 120 and pass through the separation plate 130. The connection rods 210 and 220 having passed through the separation plate 130 extend to come out of the connection mount 140 through the bottom of the sealed connection mount 140.

The shaft 120 has the shape of a pipe having a through-hole, and is coupled to the bottom surface of the insulating plate 110. The shaft 120 is formed of a ceramic material identical to that of the insulating plate 110, and may be coupled. The ceramic material may be at least one among $Al_2O_3$, $Y_2O_3$, $Al_2O_3/Y_2O_3$, $ZrO_2$, autoclaved lightweight concrete (AlC), TiN, AlN, TiC, MgO, CaO, $CeO_2$, $TiO_2$, $B_xC_y$, BN, $SiO_2$, SiC, YAG, mullite, and $AlF_3$, and may be preferably aluminum nitride (AlN). Furthermore, powder of the ceramic material may be molded and sintered to form the shaft 120. In this regard, each ceramic powder may optionally contain yttrium oxide powder in an amount of about 0.1 to 10% and preferably in an amount of about 1 to 5%.

As described below, the shaft 120 may be coupled to the insulating plate 110 by an adhesive material 125 such as ceramic paste. In some cases, the shaft 120 may be mechanically coupled to the insulating plate 110 by using a bolt, a nut, etc. The rods 121, 122, 210, and 220 for supplying power to the high-frequency electrode 112 and (or) the heating element 114 are received through the through-holes of the shaft 120, and the rods extend so as to come out while passing through the sealed connection mount 140.

The ceramic susceptor 100 according to an embodiment of the present disclosure is configured such that, in particular, at least two connection rods 121 and 122 in the shaft 20, connected to the high-frequency electrode 112 are connected to each other in the sealed connection mount 140 having a cooling structure (including an inlet 191 and an outlet 192 for circulation of a cooling medium). Therefore, even when RF power increases, there is no crack occurrence around the high-frequency electrode 112 and the rods 121 and 122 connected to the high-frequency electrode 112 though branching of electric current in the multiple connection rods 121 and 122, there is no arching, and it is possible to uniform characteristics of film forming of on a substrate by heating, and electrical characteristics can be maintained without occurrence of short circuit due to oxidization of the rods 121 and 122 connected to the high-frequency electrode 112. In particular, the connection mount 140 maintains cooling, and thus is not exposed to high temperature like the existing shaft inside. Furthermore, the connection rods 121 and 122 and the connection member 141 are placed in the connection mount 140, and thus are not easily oxidized, and are configured to maintain electrical characteristics without oxidization and short circuit occurrence thanks to cooling of the inside of the connection mount 140. Furthermore, conventionally, it was not easy to connect high-frequency electrode rods to each other in a small-diameter hole of a shaft, whereas in the present disclosure, the connection member 141 is not placed in the shaft 120 but is included in the connection mount 140, and thus it is possible to more easily connect the connection rods 121 and 122 to each other through the connection member 141 than the existing structure.

In the present disclosure, as illustrated in FIG. 2, a description has been made of a configuration in which multiple connection rods 121 and 122 connected to one high-frequency electrode 112 are connected to each other by the connection member 141 in the connection mount 140, but is not limited thereto. In some cases, the high-frequency electrode 112 may include at least two separation electrodes (e.g., two separation electrodes including a first high-frequency electrode and a second high-frequency electrode). A configuration in which the multiple connection rods are electrically connected to the multiple separation electrodes, respectively, is possible. The former case in which multiple connection rods are connected to one high-frequency electrode 112 may be a structure that is good for preventing crack occurrence due to the thermal expansion coefficient difference between the connection rods 121 and 122 and the insulating plate 110 by minimizing the size of a through-hole formed in the insulating plate 110 in order to connect the connection rods 121 and 122 to the terminal of the high-frequency electrode 112.

Referring to FIGS. 2 and 3, the connection mount 140 is connected to the longitudinal end of the shaft 120. The connection mount 140 may be mechanically coupled to the shaft 120 while the separation plate 130 formed at the longitudinal end of the shaft 120 is interposed therebetween. The shaft 120 and the separation plate 130 may be mechanically connected to each other by using a bolt, a nut, etc. Furthermore, a connection between the upper portion of the connection mount 140 and the separation plate 130, coupled to the shaft 120, may be made as mechanical coupling by using a bolt, a nut, etc. The peripheries of through-holes of the separation plate 130, formed for the connected rods 121, 122, 210, and 220 passing through the separation plate 130, are tightly sealed by paste or the like formed of the above-described ceramic material, and the upper portion of the connection mount 140 may be fastened so as to surround the circumference of the separation plate 130. The space between the upper portion of the connection mount 140 and the separation plate 130 is also tightly sealed by a paste or the like formed of the above-described ceramic material.

In the case of the bottom surface of the connection mount 140, the peripheries of holes, through which the connection rods 121, 122, 210, 220, and 129 and the temperature sensor 180 pass, are also tightly sealed by paste or the like formed of the above-described ceramic material. The bottom surface of the connection mount 140 may be manufactured integrally with the body wall surface of the connection mount 140, as illustrated in FIGS. 2 and 3, but is not limited thereto. A separate bottom plate may also be mechanically coupled to the body wall surface of the connection mount 140 by using a bolt, a nut, etc. so that the connection mount 140 is sealed.

Figure 4:
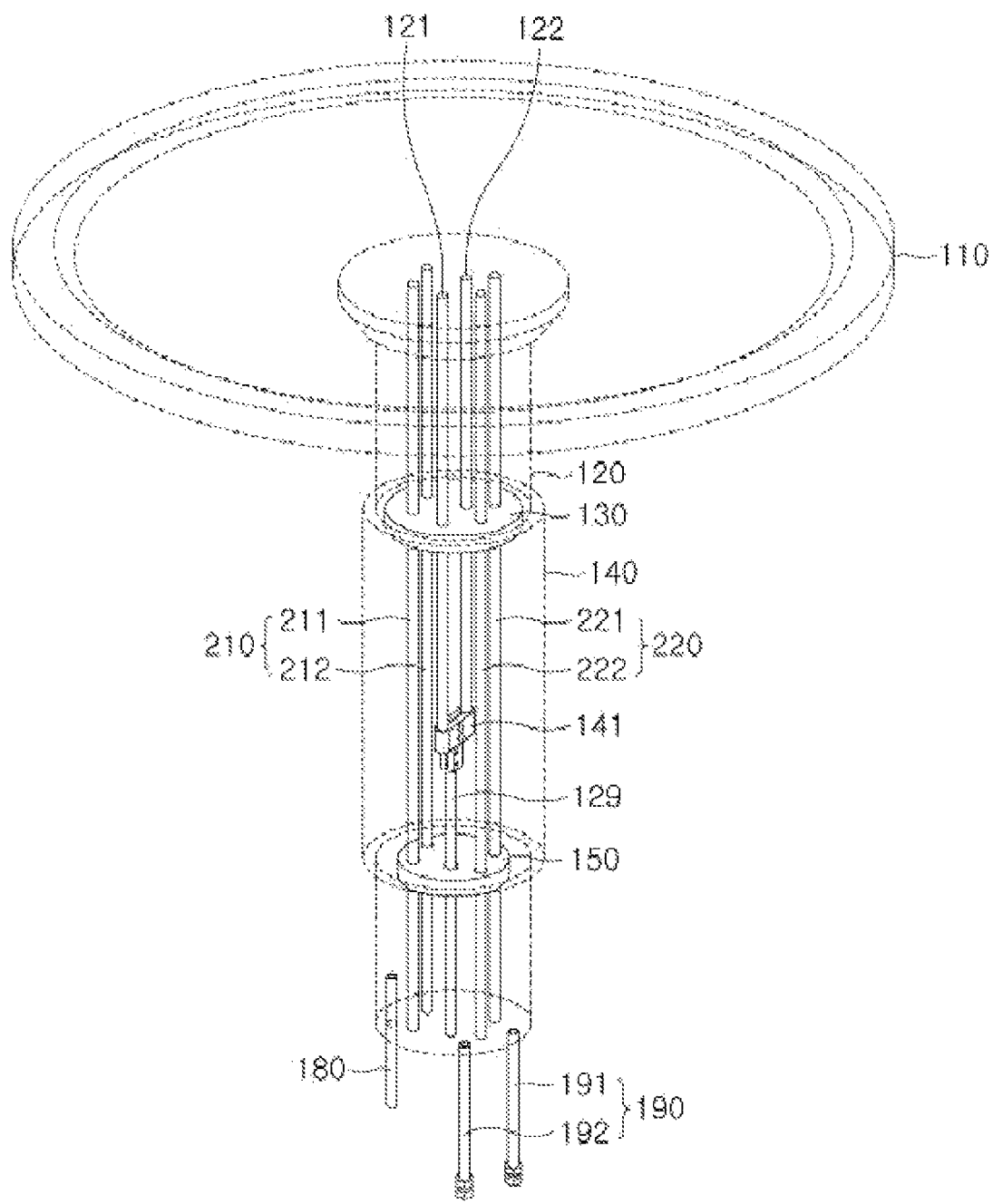
FIG. 4 is a specific configuration view of inner structures of a connection mount and a shaft of a ceramic susceptor according to an embodiment of the present disclosure.

FIG. 4 is a specific configuration view of inner structures of the connection mount 140 and the shaft 120 of the ceramic susceptor 110 according to an embodiment of the present disclosure.

Referring to FIG. 4, the connection rods 121 and 122 connected to the high-frequency electrode 112 pass through the longitudinal end of the shaft 120 in the shaft 120 to extend to the connection mount 140. That is, the connection rods 121 and 122 are disposed to pass through the separation plate 130 formed at the longitudinal end of the shaft 120. The connection rods 121 and 122 having passing through the separation plate 130 are separated into two, are connected (short-circuited) to each other by the connection member 141 disposed in the sealed connection mount 140, and the draw-in rod 129 connected to the connection member 141 extends so as to come out of the connection mount 140 through the bottom of the connection mount 140. The draw-in rod 129 is connected to a power source (e.g., a ground) so that the high-frequency electrode 112 becomes a one-side electrode of a high-frequency power source.

Figure 5A:
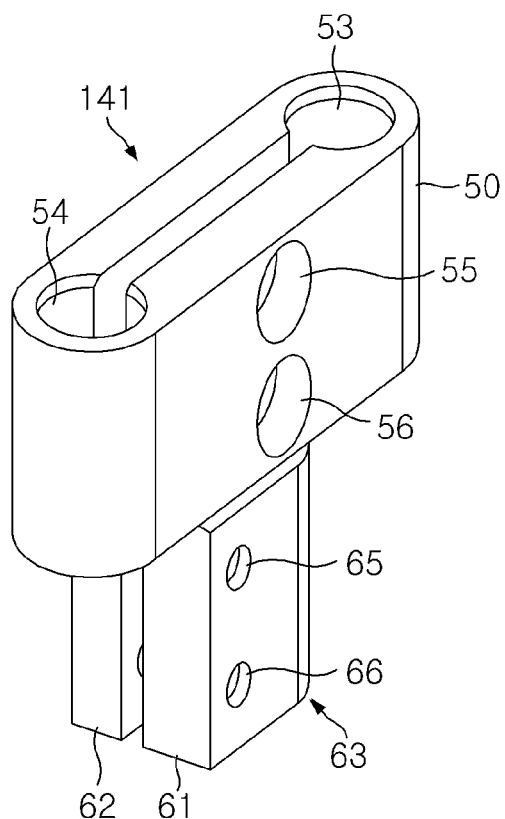
FIGS. 5A and 5B are an enlarged perspective view and an enlarged bottom view illustrating a connection member of a ceramic susceptor according to an embodiment of the present disclosure.
Figure 5B:
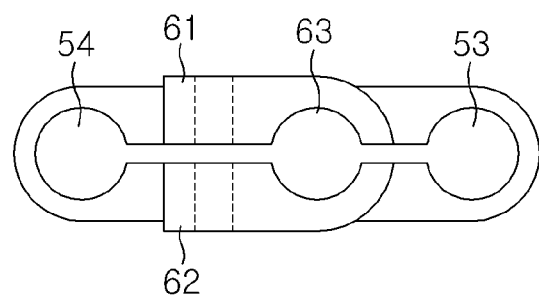

FIGS. 5A and 5B are an enlarged perspective view and an enlarged bottom view illustrating the connection member 141 of the ceramic susceptor 110 according to an embodiment of the present disclosure.

Referring to FIGS. 5A and 5B, the connection member 141 may be formed of a metal material having excellent electric conductivity, such as Cu, BeCu, Au-coated metal, Au, or Ag, and has a 'T' shape. The connection member 141 includes holes 53 and 54, which are formed in a one-side body 50 and into which the connection rods 121 and 122 connected to the high-frequency electrode 112 are inserted, and a hole 63, which is formed in the opposite side thereof and into which the draw-in rod 129 is inserted. When ends of the connection rods 121 and 122 and the draw-in rod 129, which are inserted into the holes 53, 54, and 63, are configured to be brought into surface-contact while having a circular shape, the holes 53, 54, and 63 are formed in circular shapes as in the drawings. In some cases, the ends of the connection rods 121 and 122 and the draw-in rod 129 are manufactured in polygonal shapes such as a quadrangular shape, and the holes 53, 54, and 63 corresponding thereto are formed in the corresponding polygonal shapes, thereby enabling electrical contact therebetween.

As illustrated in FIGS. 5A and 5B, the connection rods 121 and 122 may be easily inserted into the holes 53 and 54 of the one-side body 50 of the connection member 141 due to the gap between the holes 53 and 54, and the connection rods 121 and 122 may be tightly fixed to the connection member 141 by screws fastened to one or more screw holes 55 and 56 of the body 50.

A portion 61 extending from the body 50 also includes one or more screw holes 65 and 66, and the draw-in rod 129 is inserted into the hole 63. A separate connection piece 62 is included behind the portion 61 extending from the body 50. The draw-in rod 129 is coupled by disposing the draw-in rod 129 at a position of the hole 63 of the portion 61 extending from the body 50 and backing the same with the connection piece 62. That is, the connection piece 62 is engaged with the portion 61 extending from the body 50 through screws fastened to the screw holes 65 and 66, and thus the draw-in rod 129 may be tightly fixed to the connection member 141.

Thus, the connection rods 121 and 122 passing through the separation plate 130 and connected to the high-frequency electrode 112 are separated into two, and are connected (short-circuited) to each other by the connection member 141 disposed in the connection mount 140, and the draw-in rod 129 connected to the connection member 141 extends so as to come out of the connection mount 140 through the bottom surface of the connection mount 140.

In FIG. 4, the connection rods 210 and 220 connected to the heating element 114 are disposed to pass through the inside of the shaft 120 and pass through the separation plate 130. The connection rods 210 and 220 having passed through the separation plate 130 extend so as to come out of the sealed connection mount 140 through the bottom surface of the connection mount 140.

Illustrated is an example in which the connection rods 210 and 220 are formed as two pairs 211 and 212/221 and 222 and the pairs are connected to heating elements disposed in two zones of the heating element 114, respectively. Therefore, when the heating element 114 is a single heating element disposed without any zone division, only a pair of connection rods including two rods is needed as connection rods connected to the heating element 114. In addition, with respect to the heating element 114 divided into at least three zones, at least three pairs of connection rods may be disposed to pass through the inside of the shaft 120 and pass through the separation plate 130, and the connection rods having passed through the separation plate 130 may extend to come out of the sealed connection mount 140 through the bottom surface of the connection mount 140.

In FIG. 4, the ceramic susceptor 100 according to the present disclosure may further include a temperature sensor 180 (e.g., thermocouple) for measuring temperature inside the connection mount 140, and the connection mount 140 may include a cooling structure 190 for cooling the connection mount 140.

The cooling structure 190 includes an inlet 191 and an outlet 192 for circulation of a cooling medium such as air, water, gas, or cooling oil. The cooling structure 190 may include a predetermined motor pump (not shown) in order to inject a cooling medium into the connection mount 140 through the inlet 191 and discharge the cooling medium from the connection mount 140 through the outlet 192.

Furthermore, the temperature sensor 180 may be connected to a control device (not shown) such as a computer, and the temperature inside the connection mount 140 may be monitored through a display screen of the control device (not shown).

Furthermore, the control device (not shown) may also control operation of the pump (not shown), based on a temperature value measured by the temperature sensor 180. For example, when a temperature value measured by the temperature sensor 180 is equal to or higher than a threshold value (e.g., 80° C.), the control device (not shown) may operate the pump (now shown) connected to the inlet 191 and the outlet 192 to cool the connection mount 140, and when a temperature value measured by the temperature sensor 180 is lower than the threshold value (e.g., 80° C.), may perform control to stop the operation of the pump (not shown).

Furthermore, as illustrated in FIG. 4, the fixing plate 150 for fixing the connection rods 121, 122, 210, 220, and 129 may also be included in the connection mount 140 of the ceramic susceptor 100 according to the present disclosure.

That is, the draw-in rod 129, and at least one rod 121, 122, 210, and 220, which is connected to the heating element 114 and disposed to pass through the inside of the shaft 120 and pass through the separation plate 130, are fixed once again by the fixing plate 150, and thus safety such as prevention of short circuit due to shaking or the like may be maintained. The draw-in rod 129, and the at least one rod 121, 122, 210, and 220, which is connected to the heating element 114 and disposed to pass through the inside of the shaft 120 and pass through the separation plate 130, pass through the fixing plate 150 and are exposed outside through the bottom surface of the connection mount 140.

The connection mount 140, the separation plate 130, the fixing plate 150, etc., described above, may be formed of a metal material such as aluminum (Al), or may be formed of the above-described ceramic material. That is, the ceramic material may be at least one among $Al_2O_3$, $Y_2O_3$, $Al_2O_3/Y_2O_3$, $ZrO_2$, autoclaved lightweight concrete (AlC), TiN, AlN, TiC, MgO, CaO, $CeO_2$, $TiO_2$, $B_xC_y$, BN, $SiO_2$, SiC, YAG, mullite, and $AlF_3$, and may be preferably aluminum nitride (AlN). Furthermore, powder of the ceramic material may be molded and sintered to form the shaft 120. In this regard, each ceramic powder may optionally contain yttrium oxide powder in an amount of about 0.1 to 10% and preferably in an amount of about 1 to 5%.

Furthermore, all of conductors of inner cores of the connection rods 121, 122, 210, and 220 and the draw-in rod 129, described above, may be formed to be covered by tubes formed of the above-described ceramic material. That is, each of the connection rods 121, 122, 210, and 220 disposed in the shaft 120 is covered by a tube formed of the above-described ceramic material. Furthermore, the connection rods 210 and 220, which pass through the separation plate 130, pass through the fixing plate 150, and then are exposed through the bottom surface of the connection mount 140, and the draw-in rod 129, which passes through the fixing plate 150, passes through the bottom surface of the connection mount 140, and then is exposed, may be covered by tubes formed of the above-described ceramic material.

As described above, the ceramic susceptor 100 according to the present disclosure is configured such that multiple connection rods 121 and 122 in the shaft 120 connected to the high-frequency electrode 112 are connected to each other in the sealed connection mount 140 which has a cooling structure (including the inlet 191 and the outlet 192 for circulation of a cooling medium). Therefore, even when RF power increases, there is, through branch of an electric current in the multiple connection rods 121 and 122, no crack occurrence around the high-frequency electrode 112 and the rods 121 and 122 connected to the high-frequency electrode 112, there is no arching occurrence, it is possible to uniform characteristics of film forming on a substrate by heating, and electrical characteristics can be maintained without short-circuit occurrence due to oxidization of the rods 121 and 122 connected to the high-frequency electrode 112.

As described above, the present disclosure has been described through specific matters such as specific elements, and limited embodiments and drawings. However, these are merely provided to help a more general understanding of the present invention, and the present disclosure is not limited to the above-described embodiments. Further, those skilled in the art, to which the present disclosure belongs, will appreciate that various modifications and changes are possible without departing from the scope and spirit of the present disclosure. Therefore, the spirit of the present disclosure should not be limited to the described embodiments, and all of the technical ideas, which are equivalent to or corresponds to equivalent change to the claims as well as the following claims, will be construed to belong to the scope of the present disclosure.

What is claimed is:

1. A ceramic susceptor comprising:
   an insulating plate on which a high-frequency electrode is disposed;
   a shaft having one end connected to the insulating plate and having a separation plate at the other end;
   a connection mount having an upper portion connected to the other end of the shaft;
   a first rod and a second rod connected to the high-frequency electrode and extending into the connection mount through the separation plate at the other end of the shaft;
   a connection member disposed in the connection mount and connecting the first rod and the second rod extending into the connection mount to a draw-in rod; and
   a cooling structure configured to cool the connection mount;
   wherein the connection mount comprises a fixing plate configured to fix the draw-in rod, the draw-in rod passes through the fixing plate and is exposed outside through the connection mount,
   wherein the connection member includes a first hole and a second hole for fixing the first rod and the second rod to one side of the connection member, respectively, and a third hole for fixing the draw-in rod to the other side of the connection member,
   wherein the first rod and the second rod are for branching of an electric current, and
   wherein the fixing plate is provided in the inner space of the connection mount, and is spaced a predetermined distance from an upper part of the connection mount through which the first rod and the second rod pass, and a lower part of the connection mount through which the draw-in rod passes.

2. The ceramic susceptor of claim 1, wherein the high-frequency electrode comprises a first high-frequency electrode and a second high-frequency electrode, and
   the first rod is electrically connected to the first high-frequency electrode, and the second rod is electrically connected to the second high-frequency electrode.

3. The ceramic susceptor of claim 1, further comprising a temperature sensor configured to measure temperature inside the connection mount.

4. The ceramic susceptor of claim 1,
   wherein a space between the upper portion of the connection mount and the separation plate is sealed, and
   wherein the connection mount comprises an inlet and an outlet for circulation of a cooling medium, and the draw-in rod is exposed outside through the sealed connection mount.

* * * * *